United States Patent [19]
Johnson et al.

[11] Patent Number: 5,302,950
[45] Date of Patent: Apr. 12, 1994

[54] METHOD OF AND APPARATUS FOR PROVIDING AUTOMATIC DETERMINATION OF INFORMATION SAMPLING RATE

[75] Inventors: William J. Johnson, Flower Mound; Larry M. Lachman, Irving; Guillermo Vega, Grapevine; Marvin L. Williams, Lewisville, all of Tex.

[73] Assignee: International Business Machines Corp., Armonk, N.Y.

[21] Appl. No.: 915,149

[22] Filed: Jul. 17, 1992

[51] Int. Cl.$^5$ ............................................. H03M 5/00
[52] U.S. Cl. ..................................... 341/123; 341/155
[58] Field of Search ............... 341/123, 122, 124, 125, 341/155

[56] References Cited
U.S. PATENT DOCUMENTS

4,763,207  8/1988  Podolak et al. .................. 341/123 X
4,816,829  3/1989  Podolak et al. .................. 341/123 X
5,119,093  6/1992  Vogt et al. ............................. 341/123

Primary Examiner—Sharon D. Logan
Attorney, Agent, or Firm—Prentiss W. Johnson; Geoffrey A. Mantooth

[57] ABSTRACT

Method of, and apparatus for, providing automatic detection of potential information loss due to undersampling and automatic detection of potential storage waste due to oversampling based on automatic determination of an analog signal's Nyquist rate. The invention acquires an analog signal, determines a maximum frequency of the analog signal and a corresponding Nyquist rate, and allows a user to select a sampling rate based on either the automatically determined Nyquist sampling rate, a user specified sampling rate, a sampling rate determined by a user specified bandwidth, or a sampling rate determined by user specified available space. The invention also informs a user when a loss of information may occur due to a sampling rate being less than the Nyquist rate. The invention also informs a user when a waste of storage may occur due to a sampling rate being greater than the Nyquist rate.

12 Claims, 6 Drawing Sheets

METHOD OF AND APPARATUS FOR PROVIDING AUTOMATIC DETERMINATION OF INFORMATION SAMPLING RATE

TECHNICAL FIELD OF THE INVENTION

This invention relates in general to data processing systems, and in particular to a method of, and apparatus for, providing automatic determination of an information sampling rate.

BACKGROUND OF THE INVENTION

Conventional data processing systems may provide digital signal processing capabilities for converting an analog signal into digital form. When sampling an analog signal, such as audio, to convert it into digital form for storage, the number of samples taken per second (sampling rate) determines the quality of the signal that is generated when the digital signal is converted back to an analog form. According to the Nyquist Theorem, a band-limited analog signal, $x(t)$, can be reconstructed from its sample values, $x(nT)$, if the sampling rate, $1/T$, is greater than twice the highest frequency, $f$, present in $x(t)$. The sampling rate, $2*f$, is referred to as the Nyquist rate.

The sampling rate in a conventional data processing system is either determined by the designer or is left to the user to decide. If a sampling rate smaller than the Nyquist rate is chosen (undersampling), information will be lost from the original analog signal, decreasing the fidelity of the digital signal when it is played back. oversampling (selecting a sampling rate much higher than the Nyquist rate), on the other hand, will cause the sampling rate of the sampled signal to be larger than what is needed to reconstruct the signal from its samples, thus wasting valuable storage space. Conventional systems do not determine the Nyquist rate of the analog signal, and thus can not prevent the information loss caused by undersampling or the storage waste caused by oversampling. This problem is compounded in a multimedia data processing system which may be converting multiple analog signals, all with differing Nyquist rates.

The prior art approaches present the user with seven difficulties. The first difficulty is that the prior art approaches do not automatically determine the Nyquist rate of an analog signal. The second difficulty is that the prior art approaches do not automatically determine a sampling rate for an analog signal based on the analog signal's Nyquist rate. The third difficulty is that the prior art approaches do not inform a user that a loss of information due to undersampling may occur. The fourth difficulty is that the prior art approaches do not inform a user that a waste of storage due to oversampling may occur. The fifth difficulty is that the prior art approaches do not provide a user a choice of alternative actions when such a loss of information or a waste of storage may occur. The sixth difficulty is that the prior art approaches do not adjust a sampling rate to prevent either a loss of information or a waste of storage. The seventh difficulty is that the prior art approaches do not adjust a sampling rate to available storage.

Thus the prior art provides no method of, or apparatus for, automatic detection of potential information loss due to undersampling and automatic detection of potential storage waste due to oversampling based on automatic detection of an analog signal's Nyquist rate. As such, there is a need for a method of, and apparatus for, providing automatic detection of potential information loss due to undersampling and automatic detection of potential storage waste due to oversampling based on automatic determination of an analog signal's Nyquist rate.

SUMMARY OF THE INVENTION

The invention disclosed herein comprises a method of, and apparatus for, providing automatic detection of potential information loss due to undersampling and automatic detection of potential storage waste due to oversampling based on automatic determination of an analog signal's Nyquist rate. The method and apparatus described herein substantially eliminate or reduce the difficulties of conventional systems which may allow information loss due to undersampling and storage waste due to oversampling.

In accordance with one aspect of the present invention, automatic detection of a highest frequency component of an analog signal is provided.

Another aspect of this invention is automatic determination of a Nyquist rate of an input signal.

Yet another aspect of this invention is automatic detection of potential information loss due to undersampling.

Yet another aspect of this invention is automatic detection of potential storage waste due to oversampling.

Yet another aspect of this invention is that it provides a user with the ability to sample and store an analog signal at a sampling rate equal to an automatically determined Nyquist rate.

Yet another aspect of this invention is that it provides a user with the ability to sample and store an analog signal at a user specified sampling rate.

Yet another aspect of this invention is that it provides a user with the ability to sample and store an analog signal at a sampling rate determined by a user specified maximum frequency component of an analog signal.

Yet another aspect of this invention is that it provides a user with the ability to sample and store an analog signal at a sampling rate determined by user specified available storage.

The present invention has the advantage of providing a method of improving data processing systems.

The present invention has the further advantage of interactively notifying a user about a loss of information due to a specified sampling rate.

The present invention has the further advantage of interactively notifying a user when oversampling is being performed. This method allows the user to conserve storage space.

The present invention has the further advantage of allowing a user to decide whether a loss of information due to undersampling is acceptable or not.

The present invention has the further advantage of allowing a user to decide whether a waste of storage due to oversampling is acceptable or not.

The present invention has the further advantage of allowing a user to define sampling rates based on criteria such as available storage, analog signal duration, analog signal frequency content, analog signal Nyquist rate, and user preferred sampling rates.

BRIEF DESCRIPTION OF THE DRAWINGS

For a more complete understanding of the present invention and the advantages thereof, reference is now made to the Detailed Description in conjunction with the attached Drawings, in which.

DETAILED DESCRIPTION OF THE INVENTION

Figure 1:
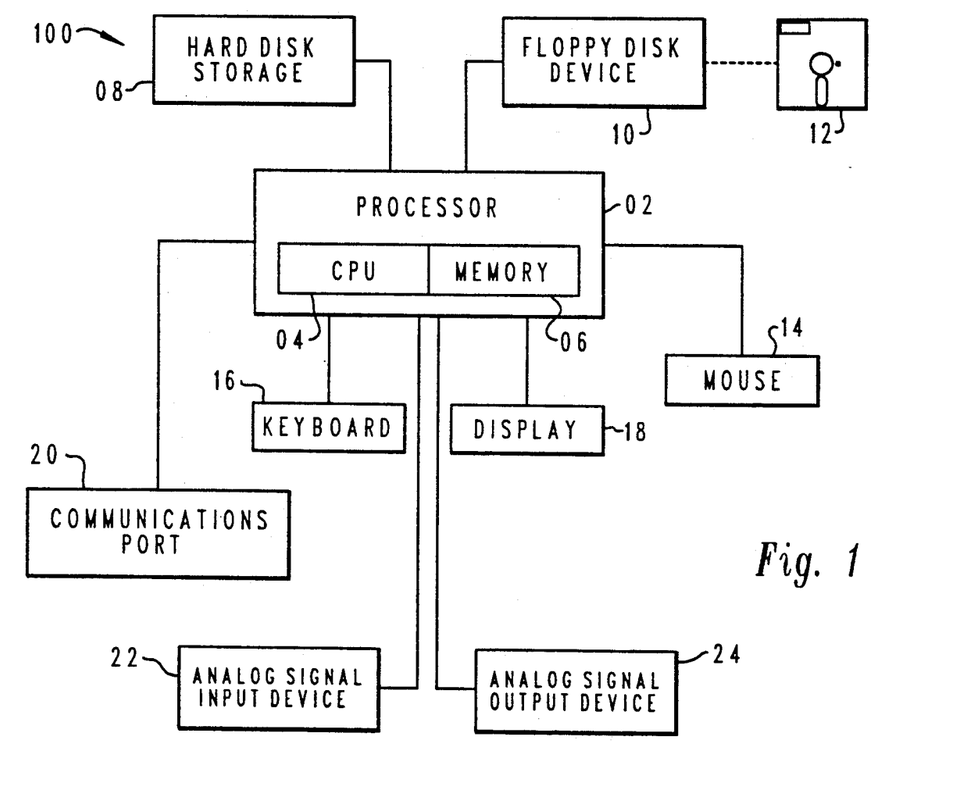
FIG. 1 is a block diagram of a data processing system used in performing the method of the present invention and forming part of the apparatus of the present invention.

Referring first to FIG. 1, there is shown in block diagram form, a data processing system 100 according to the present invention. The data processing system 100 includes a processor 02, which includes a central processing unit (CPU) 04, and a memory 06. Additional memory, in the form of a hard disk file storage 08 and a floppy disk device 10, is connected to the processor 02. Floppy disk device 10 receives a diskette 12 which has computer program code recorded thereon that implements the present invention in the data processing system 100. The data processing system 100 may include user interface hardware, including a mouse 14 and a keyboard 16 for allowing user input to the processor 02 and a display 18 for presenting visual data to the user. The data processing system 100 may also include a communications port 20 for communicating with a network or other data processing systems. The data processing system 100 may also include analog signal devices, including an analog signal input device 22 for entering analog signals into the data processing system 100, and an analog signal output device 24 for reproducing analog signals.

Referring now to FIG. 2 through FIG. 6, flowcharts illustrating operations preferred in carrying out the present invention are shown. In the flowcharts, the graphical conventions of a diamond for a test or decision and a rectangle for a process or function are used. These conventions are well understood by those skilled in the art, and the flowcharts are sufficient to enable one of ordinary skill to write code in any suitable computer programming language.

The operations preferred in carrying out the present invention are implemented as five processes or programs comprising a Main Process, a sampling and Storage Process, a User Specified Sampling Rate Process, a User Specified Frequency Process, and a User Specified Available Storage Process.

Figure 2:
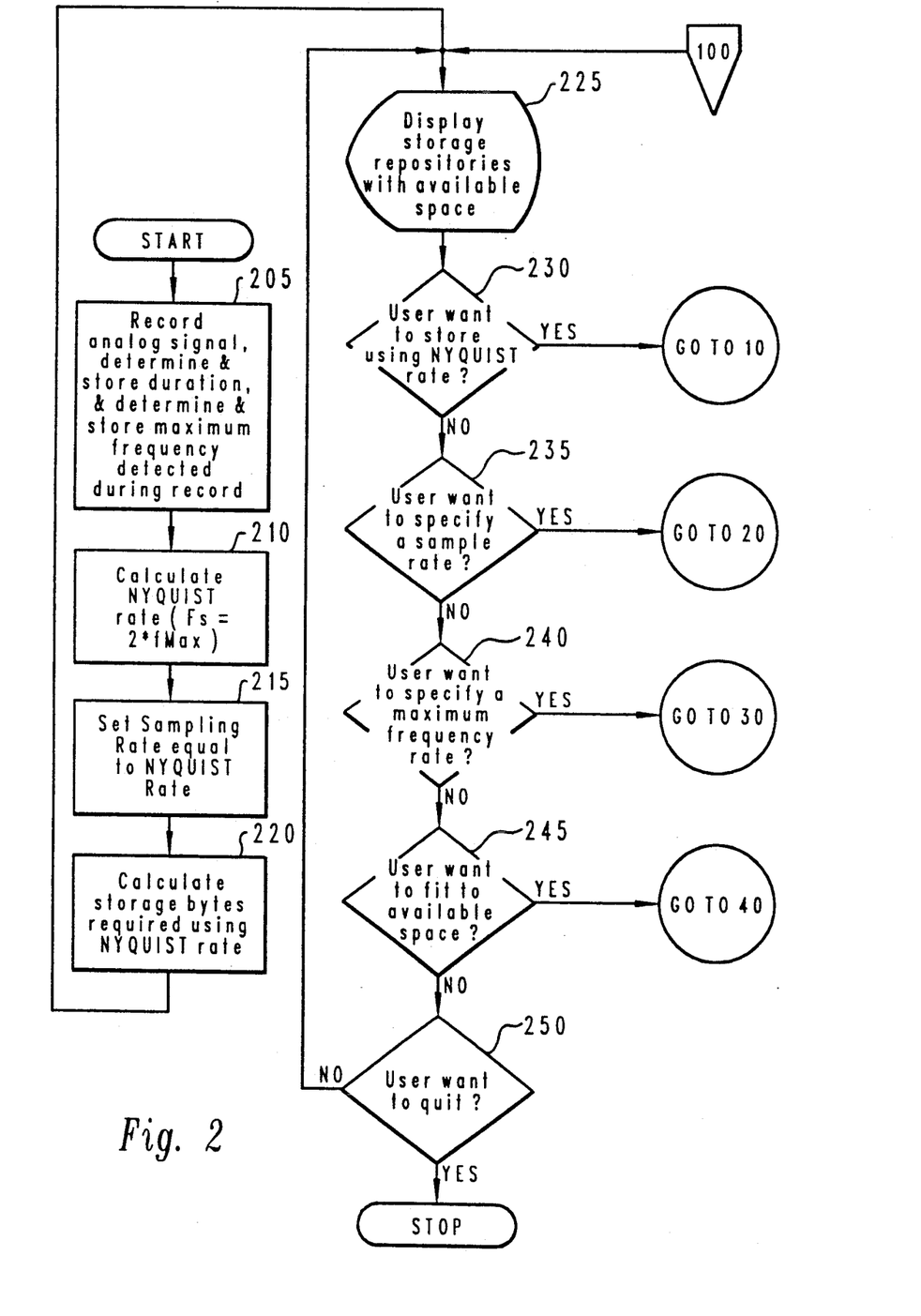
FIG. 2 is a flow chart illustrating the operations preferred in carrying out the the present invention.

The Main Process, illustrated in FIG. 2, acquires an analog signal, determines a maximum frequency of the analog signal and a corresponding Nyquist rate, and allows a user to select a sampling rate based on either the automatically determined Nyquist sampling rate, a user specified sampling rate, a sampling rate determined by a user specified frequency, or a sampling rate determined by user specified available space.

Figure 3:
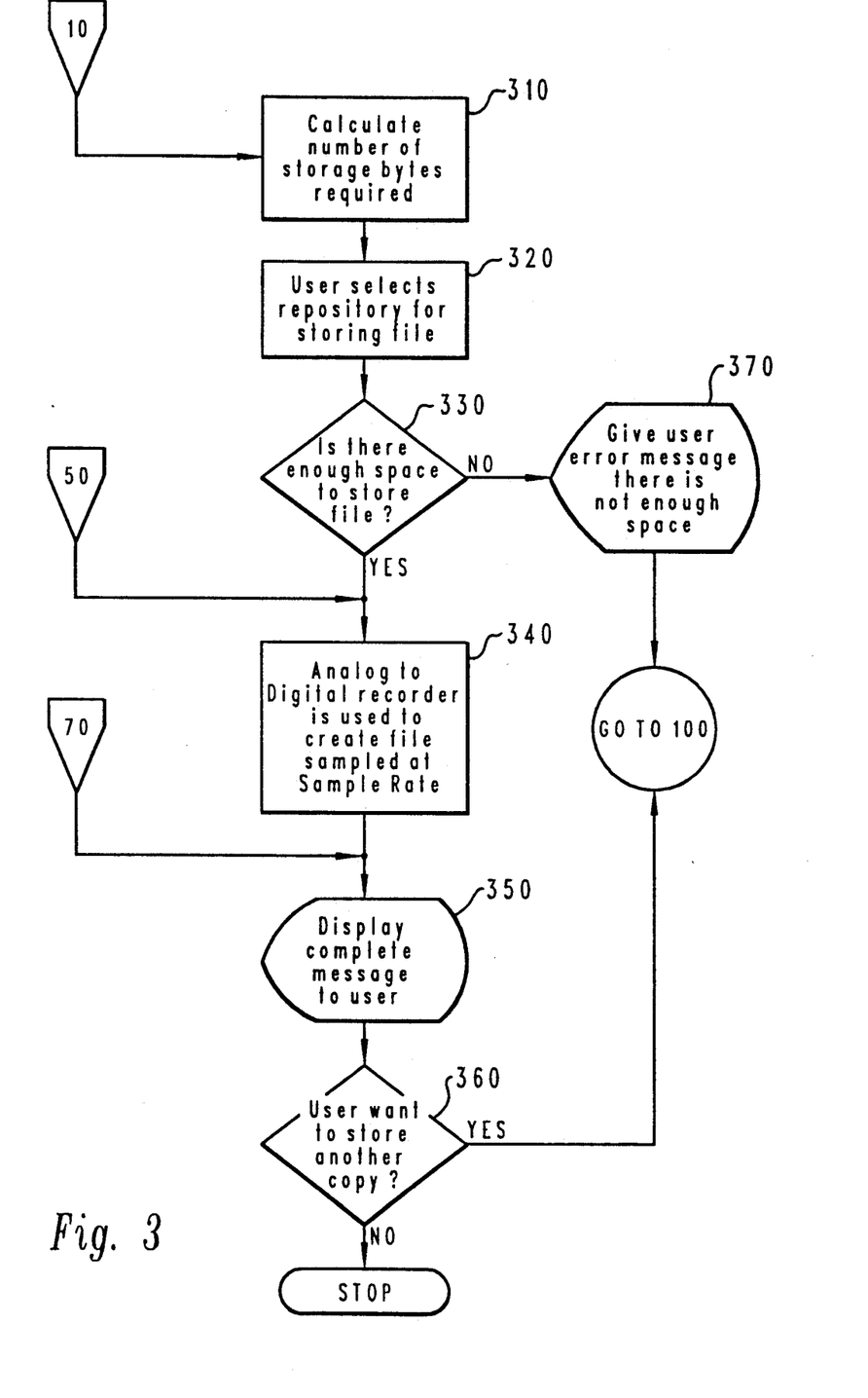
FIG. 3 is a flow chart, continued from FIG. 2, illustrating the operations preferred in carrying out the Sampling and Storage Process portion of the present invention.

The Sampling and storage Process, illustrated in FIG. 3, calculates an amount of storage required based on a sampling rate, allows user selection of a storage repository, samples the analog signal at the sampling rate, and stores samples in the selected storage repository.

Figure 4:
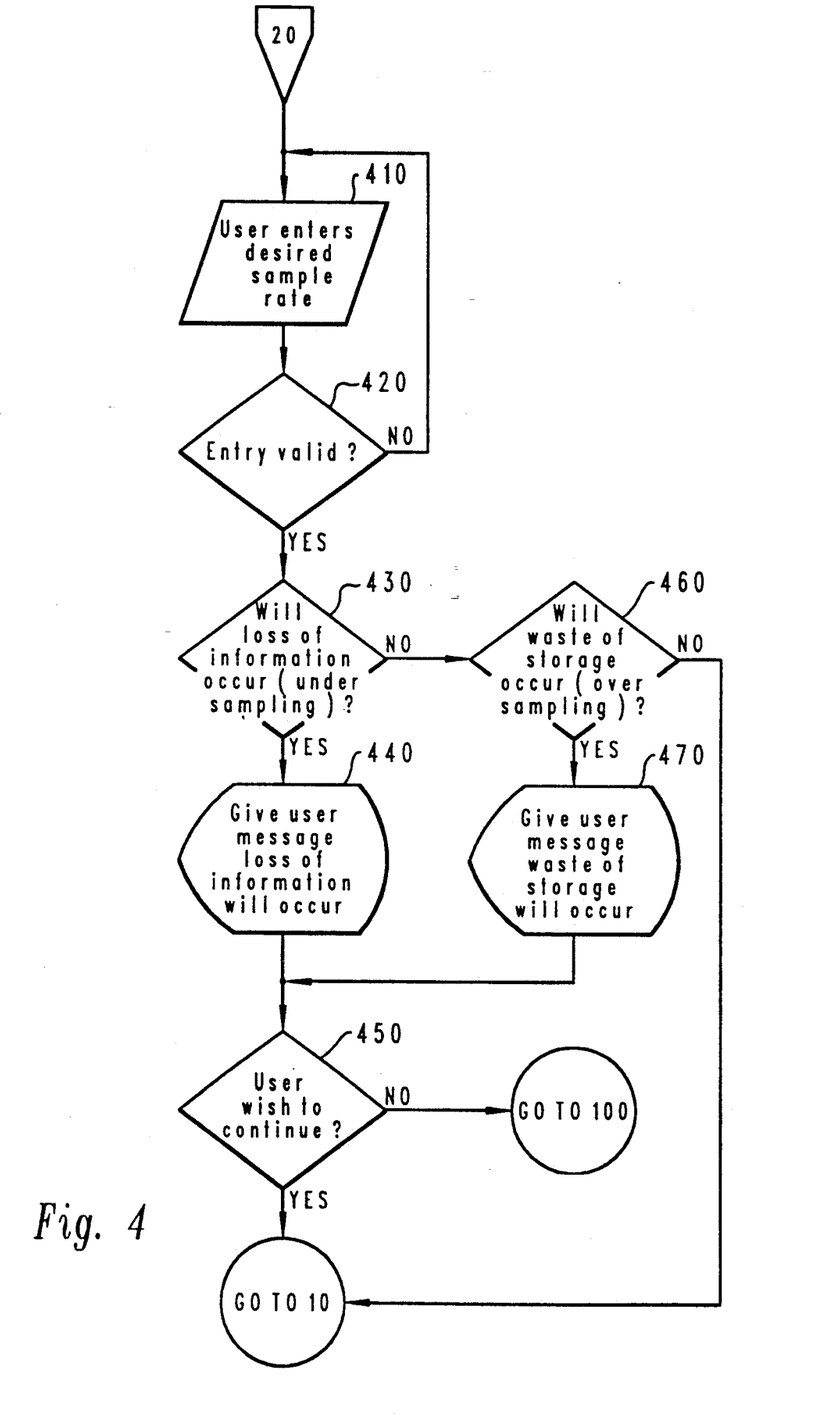
FIG. 4 is a flow chart, continued from FIG. 2, illustrating the operations preferred in carrying out the User Specified Sampling Rate Process portion of the present invention.

The User Specified Sampling Rate Process, illustrated in FIG. 4, allows a user to select a specified sampling rate and informs the user when a loss of information may occur due to the specified sampling rate being less than the Nyquist rate. The user is also informed when a waste of storage may occur due to the specified sampling rate being greater than the Nyquist rate.

Figure 5:
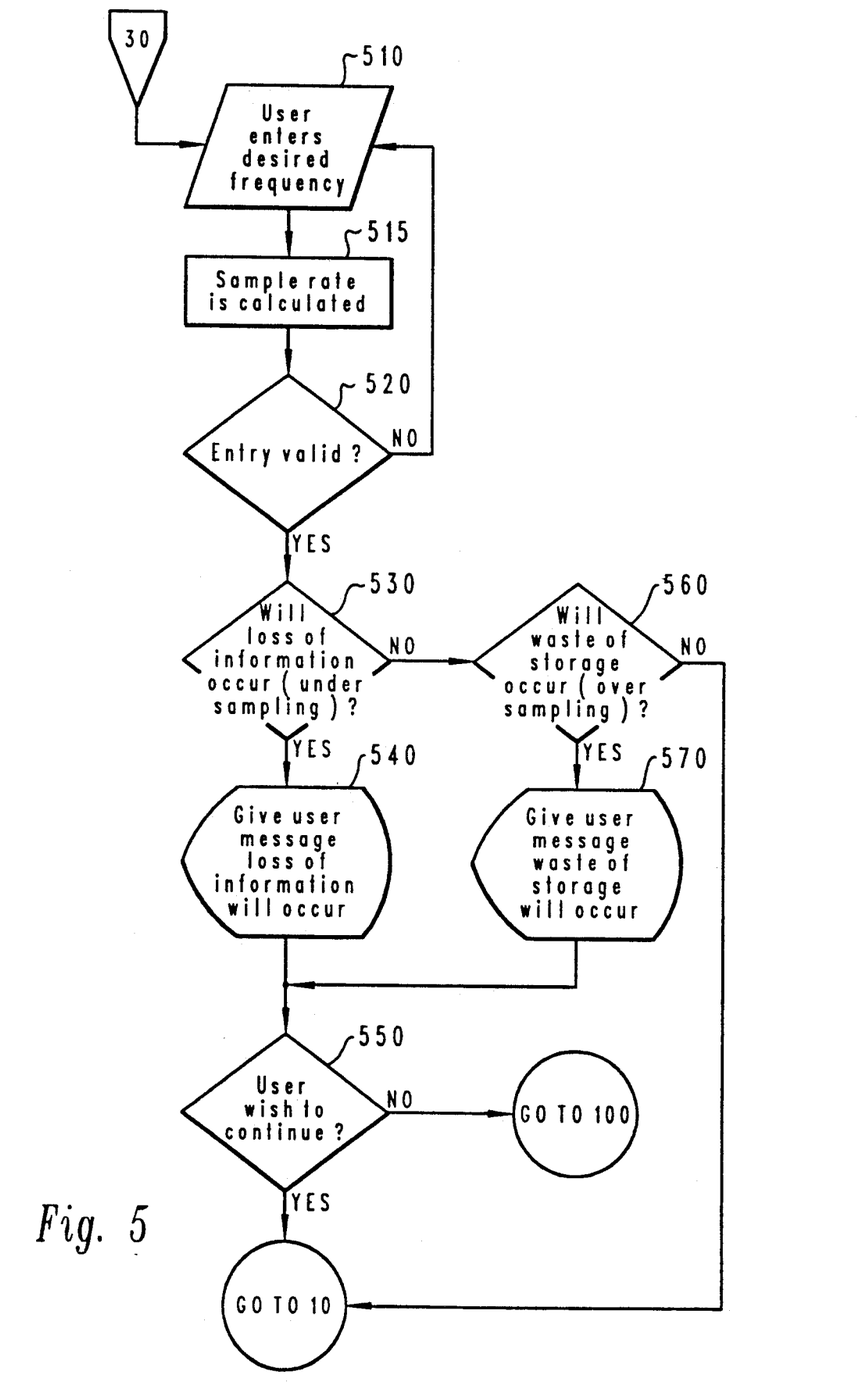
FIG. 5 is a flow chart, continued from FIG. 2, illustrating the operations preferred in carrying out the User Specified Frequency Process portion of the present invention.

The User Specified Frequency Process, illustrated in FIG. 5, allows a user to select a maximum frequency of interest in the analog signal and informs the user when a loss of information may occur due to the specified frequency being less than the analog signal bandwidth. The user is also informed when a waste of storage may occur due to the specified frequency being greater than the analog signal bandwidth.

Figure 6:
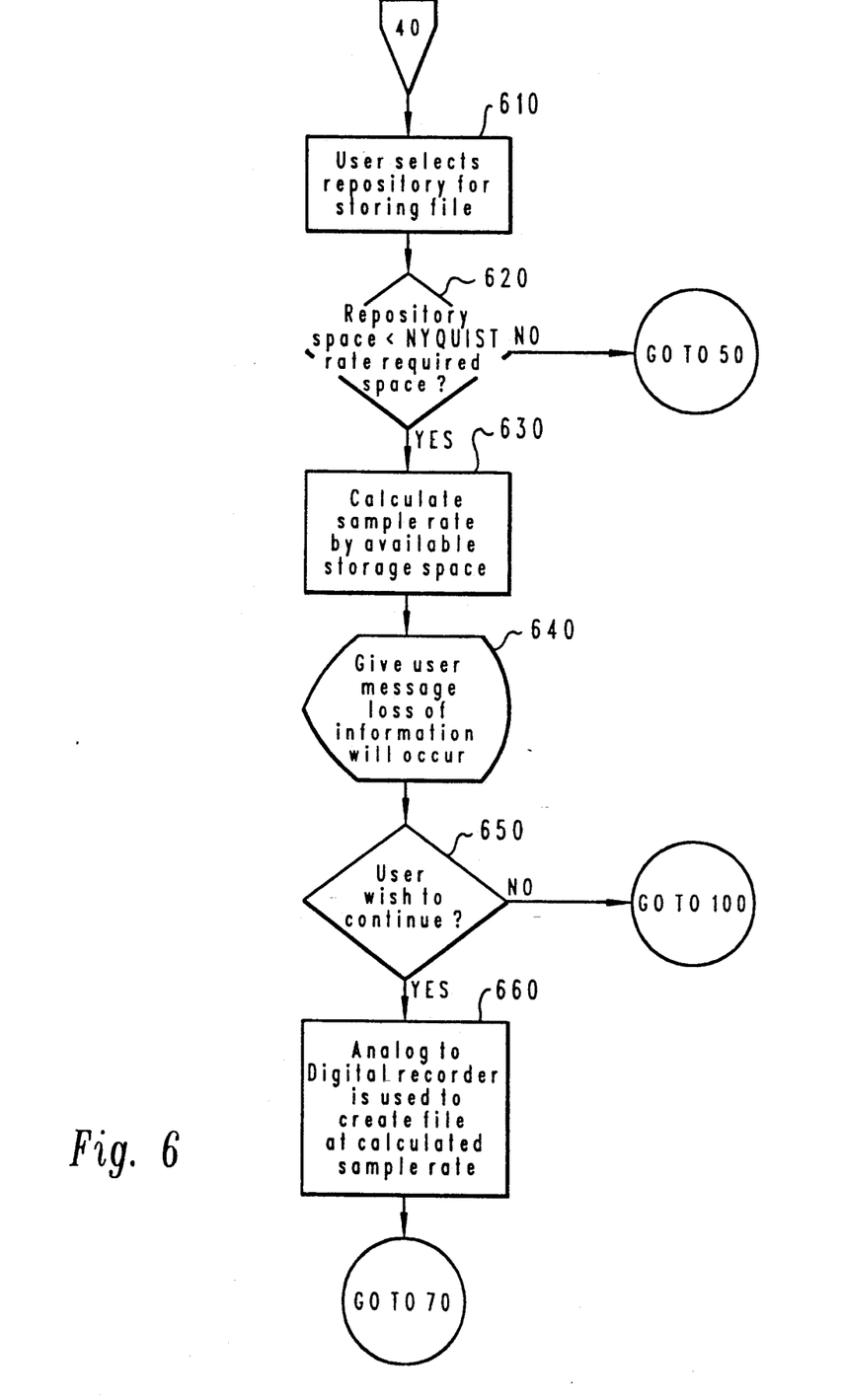
FIG. 6 is a flow chart, continued from FIG. 2, illustrating the operations preferred in carrying out the User specified Available Storage Process portion of the present invention.

The User Specified Available Storage Process, illustrated in FIG. 6, allows a user to select a specified storage repository and informs the user when a loss of information may occur due to the size of the storage repository being less than that size required to store the analog signal at the Nyquist rate.

As shown in FIG. 2, which illustrates the operations preferred in carrying out the Main Process portion of the present invention, after the start of the program, process block 205 records an analog signal, measures the duration of the recording, stores the duration of the recording in a Duration Register, determines the maximum frequency of the analog signal, and stores the maximum frequency detected during the recording in a Maximum Frequency Register. The recording may either be a continuous analog recording or a digital recording. If the recording is a digital recording, then the analog to digital conversion technique should be one of the over-sampling analog to digital conversion techniques. Over-sampling analog to digital conversion techniques were originally developed to address hardware cost and signal noise concerns. Hardware costs may be lowered by implementing a simpler converter operating at a higher conversion rate. Signal noise may also be controlled by operating a converter at a higher rate. The present invention does not use over-sampling to accomplish either of these original objectives, but instead uses over-sampling to allow automatic detection of a Nyquist rate and automatic detection of a potential loss of information. Those skilled in the art recognize that the determination of the maximum frequency of the analog signal may be accomplished by any of a number of conventional techniques. Analog techniques include bandpass filter banks, zero crossing detectors, and slope detectors. Digital techniques include Fourier Transforms, Fast Fourier Transforms, Winnograd Transforms, and digital bandpass filters.

Thereafter, process block 210 calculates a Nyquist Rate of the analog signal and stores the calculated Nyquist Rate in a Nyquist Rate Register. The Nyquist Rate of the analog signal is calculated by multiplying the contents of the maximum Frequency Register by two (2). Alternatively, the contents of the Nyquist Rate Register may be calculated by multiplying the Nyquist Rate by a factor. The factor compensates for the actual performance of the analog to digital converter. The use of such a factor is well known by those skilled in the art.

Thereafter, process block 215 sets the contents of a Sampling Rate Register equal to the contents of the Nyquist Rate Register. The Sampling Rate Register contains a number representing the rate at which the analog signal will be sampled. Process block 215 represents the default of automatically sampling the analog signal at its Nyquist rate to prevent a loss of information, Thereafter, process block 220 calculates the amount of storage required to store the sampled analog signal by multiplying a number of bytes per sample times the product of the contents of the Sampling Rate Register times the contents of the Duration Register. Process block 220 also stores the result in a Required Storage Register.

Thereafter, process block 225 determines and displays to the user those storage repositories with available storage.

Thereafter, decision block 230 determines if the user wishes to sample and store the analog signal at the Nyquist rate. If the user does not wish to sample and store the analog signal at the Nyquist rate, then decision block 235 determines if the user wishes to sample and store the analog signal at a user specified sampling rate. If the user does not wish to sample and store the analog signal at a user specified sampling rate, then decision block 240 determines if the user wishes to sample and store the analog signal at a sampling rate determined by a user specified frequency. If the user does not wish to sample and store the analog signal at a sampling rate determined by a user specified frequency, then decision block 245 determines if the user wishes to sample and store the analog signal at a sampling rate determined by user specified available storage. If the user does not wish to sample and store the analog signal at a sampling rate determined by user specified available storage, then decision block 250 determines if the user wishes to quit. If the user wishes to quit, then the program stops. If the user does not wish to quit, then the program loops back to process block 225.

Returning now to decision block 230, if the user wishes to sample and store the analog signal at the Nyquist rate, then processing continues to process block 310 as shown on FIG. 3. This processing path is illustrated by flowchart connectors 10 on FIG. 2 and FIG. 3.

Returning now to decision block 235, if the user wishes to sample and store the analog signal at a user specified sampling rate, then processing continues to process block 410 as shown on FIG. 4. This processing path is illustrated by flowchart connectors 20 on FIG. 2 and FIG. 4.

Returning now to decision block 240, if the user wishes to sample and store the analog signal at a sampling rate determined by a user specified frequency, then processing continues to process block 510 as shown on FIG. 5. This processing path is illustrated by flowchart connectors 30 on FIG. 2 and FIG. 5.

Returning now to decision block 245, if the user wishes to sample and store the analog signal at a sampling rate determined by user specified available storage, then processing continues to process block 610 as shown on FIG. 6. This processing path is illustrated by flowchart connectors 40 on FIG. 2 and FIG. 6.

Referring next to FIG. 3, the operations preferred in carrying out the Sampling and Storage portion of the present invention are illustrated. After control passes from decision block 230 on FIG. 2 to process block 310 on FIG. 3, as illustrated by flowchart connectors 10 on FIG. 2 and FIG. 3, process block 310 calculates the amount of storage required to store the sampled analog signal by multiplying a number of bytes per sample times the product of the contents of the Sampling Rate Register times the contents of the Duration Register. Process block 310 also stores the result in a Required Storage Register.

Thereafter, process block 320 allows the user to select a storage repository for storing the sampling analog signal.

Thereafter, decision block 330 determines if there is sufficient storage in the storage repository selected by the user by comparing the size of the selected storage repository to the contents of the Required Storage Register. If there is sufficient storage in the storage repository selected by the user, then process block 340 performs an analog to digital conversion of the analog signal by sampling the analog signal at a sampling rate equal to the contents of the Sampling Rate Register and stores the samples in the storage repository selected by the user.

Thereafter, process block 350 displays a message to the user that the sampling and storage process is complete.

Thereafter, decision block 360 determines if the user wishes to store another copy. If the user does not wish to store another copy, then the program stops. If the user wishes to store another copy, then control passes to process block 225 on FIG. 2. This processing path is illustrated by flowchart connectors 100 on FIG. 3 and FIG. 2.

Returning now to decision block 330, if there is not sufficient storage in the storage repository selected by the user, then process block 370 displays a message to the user that there is not sufficient storage in the storage repository selected by the user. Thereafter, control passes to process block 225 on FIG. 2. This processing path is illustrated by flowchart connectors 100 on FIG. 3 and FIG. 2.

Referring next to FIG. 4, the operations preferred in carrying out the User Specified Sampling Rate Process portion of the present invention are illustrated. After control passes from decision block 235 on FIG. 2 to process block 410 on FIG. 4, as illustrated by flowchart connectors 20 on FIG. 2 and FIG. 4, process block 410 allows the user to enter a user specified sampling rate. Process block 410 also stores the user specified sampling rate in the Sampling Rate Register.

Thereafter, decision block 420 determines if the user specified sampling rate is a valid entry by comparing the contents of the Sampling Rate Register to the contents of a Minimum Sampling Rate Register and a Maximum Sampling Rate Register. The contents of the Minimum Sampling Rate Register represent the minimum sampling rate at which analog to digital conversion may be performed by the converter. The contents of the Maximum Sampling Rate Register represent the maximum sampling rate at which analog to digital conversion may be performed by the converter. The contents of the Minimum Sampling Rate Register and the Maximum Sampling Rate Register are configurable to reflect the actual capabilities of the converter.

If the user specified sampling rate is a valid entry, then decision block 430 determines if a loss of information will occur at the user specified sampling rate. A loss of information will occur if the user specified sampling rate is less than the Nyquist Rate. This determination is accomplished by comparing the contents of the Sampling Rate Register to the contents of the Nyquist Rate Register. If the contents of the Sampling Rate Register are less than the contents of the Nyquist Rate Register, then a loss of information will occur.

If a loss of information will not occur at the user specified sampling rate (if the contents of the Sampling Rate Register are greater than or equal to the contents of the Nyquist Rate Register), decision block 460 determines if a waste of storage will occur at the user specified sampling rate. This determination is accomplished by comparing the contents of the Sampling Rate Register to the contents of the Nyquist Rate Register. If the contents of the Sampling Rate Register are greater than the contents of the Nyquist Rate Register, then a waste of storage will occur. If a waste of storage will not occur at the user specified sampling rate, then control passes to process block 310 on FIG. 3. This processing path is illustrated by flowchart connectors 10 on FIG. 4 and FIG. 3.

Returning now to decision block 430, if a loss of information will occur at the user specified sampling rate (if the contents of the Sampling Rate Register are less than the contents of the Nyquist Rate Register), then process block 440 displays a message to the user that a loss of information will occur at the user specified sampling rate.

Thereafter, decision block 450 determines if the user wishes to continue to use the user specified sampling rate at which a loss of information will occur. If the user wishes to continue to use the user specified sampling rate at which a loss of information will occur, then then control passes to process block 310 on FIG. 3. This processing path is illustrated by flowchart connectors 10 on FIG. 4 and FIG. 3.

Returning now to decision block 460, if a waste of storage will occur at the user specified sampling rate (if the contents of the Sampling Rate Register are greater than the contents of the Nyquist Rate Register), then process block 470 displays a message to the user that a waste of storage will occur at the user specified sampling rate. Thereafter, decision block 450 determines if the user wishes to continue to use the user specified sampling rate at which a waste of storage will occur. If the user wishes to continue to use the user specified sampling rate at which a waste of storage will occur, then then control passes to process block 310 on FIG. 3. This processing path is illustrated by flowchart connectors 10 on FIG. 4 and FIG. 3.

Returning now to decision block 450, if the user does not wish to continue to use the user specified sampling rate at which either a loss of information or a waste of storage will occur, then control passes to process block 225 on FIG. 2. This processing path is illustrated by flowchart connectors 100 on FIG. 4 and FIG. 2.

Returning now to decision block 420, if the user specified sampling rate is not a valid entry, then the program loops back to process block 410 for the user to enter another user specified sampling rate.

Referring next to FIG. 5, the operations preferred in carrying out the User Specified Frequency Process portion of the present invention are illustrated. After control passes from decision block 240 on FIG. 2 to process block 510 on FIG. 5, as illustrated by flowchart connectors 30 on FIG. 2 and FIG. 5, process block 510 allows the user to enter a user specified frequency. This frequency is the maximum frequency of the analog signal which the user desires to retain in the sampled analog signal.

Thereafter, process block 515 stores the product of two (2) times the user specified frequency in the Sampling Rate Register.

Thereafter, decision block 520 determines if the user specified frequency is a valid entry by comparing the contents of the Sampling Rate Register to the contents of a Minimum Sampling Rate Register and a Maximum Sampling Rate Register.

If the user specified frequency is a valid entry, then decision block 530 determines if a loss of information will occur at a sampling rate determined by the user specified frequency. This determination is accomplished by comparing the contents of the Sampling Rate Register to the contents of the Nyquist Rate Register. If the contents of the Sampling Rate Register are less than the contents of the Nyquist Rate Register, then a loss of information will occur.

If a loss of information will not occur at a sampling rate determined by the user specified frequency (if the contents of the Sampling Rate Register are greater than or equal to the contents of the Nyquist Rate Register), decision block 560 determines if a waste of storage will occur at the user specified sampling rate. This determination is accomplished by comparing the contents of the Sampling Rate Register to the contents of the Nyquist Rate Register. If the contents of the Sampling Rate Register are greater than the contents of the Nyquist Rate Register, then a waste of storage will occur. If a waste of storage will not occur at the user specified sampling rate, then control passes to process block 310 on FIG. 3. This processing path is illustrated by flowchart connectors 10 on FIG. 5 and FIG. 3.

Returning now to decision block 530, if a loss of information will occur at a sampling rate determined by the user specified frequency (if the contents of the Sampling Rate Register are less than the contents of the Nyquist Rate Register), then process block 540 displays a message to the user that a loss of information will occur at a sampling rate determined by the user specified frequency.

Thereafter, decision block 550 determines if the user wishes to continue to use the sampling rate determined by the user specified frequency at which a loss of information will occur. If the user wishes to continue to use the sampling rate at which a loss of information will occur, then then control passes to process block 310 on FIG. 3. This processing path is illustrated by flowchart connectors 10 on FIG. 5 and FIG. 3.

Returning now to decision block 560, if a waste of storage will occur at the user specified sampling rate (if the contents of the Sampling Rate Register are greater than the contents of the Nyquist Rate Register), then process block 570 displays a message to the user that a waste of storage will occur at the user specified sampling rate. Thereafter, decision block 550 determines if the user wishes to continue to use the user specified sampling rate at which a waste of storage will occur. If the user wishes to continue to use the user specified sampling rate at which a waste of storage will occur, then control passes to process block 310 on FIG. 3. This processing path is illustrated by flowchart connectors 10 on FIG. 5 and FIG. 3.

Returning now to decision block 550, if the user does not wish to continue to use the sampling rate determined by the user specified frequency at which either a loss of information or a waste of storage may occur, then control passes to process block 225 on FIG. 2. This processing path is illustrated by flowchart connectors 100 on FIG. 5 and FIG. 2.

Returning now to decision block 520, if the user specified frequency is not a valid entry, then the program loops back to process block 510 for the user to enter another user specified frequency.

Referring next to FIG. 6, the operations preferred in carrying out the User Specified Available Storage Process portion of the present invention are illustrated. After control passes from decision block 245 on FIG. 2 to process block 610 on FIG. 6, as illustrated by flowchart connectors 40 on FIG. 2 and FIG. 6, process block 610 allows the user to select a storage repository for storing the sampling analog signal.

Thereafter, decision block 620 determines if there is sufficient storage in the storage repository selected by the user by comparing the size of the selected storage repository to the contents of the Required Storage Register. If there is sufficient storage in the storage repository selected by the user, then control passes to process block 340, on FIG. 3, which performs an analog to digital conversion of the analog signal. This processing path is illustrated by flowchart connectors 50 on FIG. 6 and FIG. 3.

Returning now to decision block 620, if there is not sufficient storage in the storage repository selected by the user, then process block 630 calculates and stores in the Sampling Rate Register a sampling rate determined by the available storage. This sampling rate is calculated by dividing the size of the selected storage repository by the product of a number of bytes per sample times the contents of the Duration Register.

Thereafter, process block 640 displays a message to the user that a loss of information will occur at a sampling rate determined by the user specified available storage.

Thereafter, decision block 650 determines if the user wishes to continue to use the sampling rate determined by the user specified available storage at which a loss of information will occur. If the user wishes to continue to use the sampling rate at which a loss of information will occur, then processing block 660 performs an analog to digital conversion of the analog signal by sampling the analog signal at a sampling rate equal to the contents of the Sampling Rate Register and stores the samples in the storage repository selected by the user. Thereafter, control passes to process block 350 on FIG. 3. This processing path is illustrated by flowchart connectors 70 on FIG. 6 and FIG. 3.

Returning now to decision block 650, if the user does not wish to continue to use the sampling rate determined by the user specified available storage at which a loss of information will occur, then control passes to process block 225 on FIG. 2. This processing path is illustrated by flowchart connectors 100 on FIG. 6 and FIG. 2.

Although the present invention has been particularly shown and described with reference to a preferred embodiment, it will be understood by those skilled in the art that various changes in form and detail may be made without departing from the spirit and the scope of the invention.

What is claimed is:

1. A method of analog to digital conversion of an analog signal, said method comprising the steps of:
   determining a highest frequency component of an analog signal;
   calculating a Nyquist rate responsive to the highest frequency component;
   altering a sampling rate responsive to the Nyquist rate by informing a user that the sampling rate and the Nyquist rate are not equal and allowing the user to select an appropriate action;
   the step of allowing the user to select an appropriate action further comprises the step of allowing the user to select an appropriate action wherein the sampling rate is determined automatically by a size of a user specified storage repository.

2. An apparatus for providing analog to digital conversion of an analog signal, said apparatus comprising:
   means for determining a highest frequency component of an analog signal;
   means for calculating a Nyquist rate responsive to the highest frequency component;
   means for altering a sampling rate responsive to the Nyquist rate;
   the means for altering a sampling rate responsive to the Nyquist rate further comprising means for informing a user that the sampling rate and the Nyquist rate are not equal and means for allowing the user to select an appropriate action;
   the means for allowing the user to select an appropriate action further comprises means for allowing the user to select an appropriate action wherein the sampling rate is determined automatically by a size of a user specified storage repository.

3. A method of permitting analog to digital conversion of an analog signal, said method comprising the steps of:
   providing means for determining a highest frequency component of an analog signal;
   providing means for calculating a Nyquist rate responsive to the highest frequency component;
   providing means for altering a sampling rate responsive to the Nyquist rate by providing means for informing a user that the sampling rate and the Nyquist rate are not equal and providing means for allowing the user to select an appropriate action;
   the step of providing means for allowing the user to select an appropriate action further comprises the step of providing means for allowing the user to select an appropriate action wherein the sampling rate is determined automatically by a size of a user specified storage repository.

4. A data processing program for providing analog to digital conversion of an analog signal, said data processing program comprising:
   instruction means for determining a highest frequency component of an analog signal;
   instruction means for calculating a Nyquist rate responsive to the highest frequency component;
   instruction means for altering a sampling rate responsive to the Nyquist rate;
   the instruction means for altering a sampling rate responsive to the Nyquist rate further comprising instruction means for informing a user that the sampling rate and the Nyquist rate are not equal and instruction means for allowing the user to select an appropriate action;
   the instruction means for allowing the user to select an appropriate action further comprises instruction means for allowing the user to select an appropriate action wherein the sampling rate is determined automatically by a size of a user specified storage repository.

5. The method of claim 1, further comprising the steps of:
   determining the duration of said analog signal; and
   using the duration and the sampling rate, determining if sufficient storage is available for said analog signal after conversion in said user specified storage repository.

6. The method of claim 5 further comprising the step of informing the user if sufficient storage is not available in said user specified storage repository.

7. The apparatus of claim 2, further comprising:
   means for determining the duration of said analog signal; and
   means for using the duration and the sampling rate to determine if sufficient storage is available for said analog signal after conversion in said user specified storage repository.

8. The apparatus of claim 7 further comprising means for informing the user if sufficient storage is not available in said user specified storage repository.

9. The method of claim 3, further comprising the steps of:
   providing means for determining the duration of said analog signal; and
   providing means for using the duration and the sampling rate to determine if sufficient storage is available for said analog signal after conversion in said user specified storage repository.

10. The method of claim 9 further comprising the step of providing means for informing the user if sufficient storage is not available in said user specified storage repository.

11. The data processing program of claim 4, further comprising:
    instruction means for determining the duration of said analog signal; and
    instruction means for using the duration and the sampling rate to determine if sufficient storage is available for said analog signal after conversion in said user specified storage repository.

12. The data processing program of claim 11 further comprising means for informing the user if sufficient storage is not available in said user specified storage repository.

* * * * *